(12) United States Patent
Broekaert

(10) Patent No.: US 6,366,226 B2
(45) Date of Patent: Apr. 2, 2002

(54) SYSTEM FOR QUANTIZING AN ANALOG SIGNAL UTILIZING A RESONANT TUNNELING DIODE DIFFERENTIAL TERNARY QUANTIZER

(75) Inventor: Tom P. E. Broekaert, Calabasas, CA (US)

(73) Assignee: Raytheon Company, Lexington, MA (US)

( * ) Notice: Subject to any disclaimer, the term of this patent is extended or adjusted under 35 U.S.C. 154(b) by 0 days.

(21) Appl. No.: 09/776,097

(22) Filed: Feb. 1, 2001

Related U.S. Application Data

(63) Continuation of application No. 09/478,031, filed on Jan. 5, 2000, now Pat. No. 6,229,468
(60) Provisional application No. 60/115,195, filed on Jan. 6, 1999.

(51) Int. Cl.[7] ................................................. H03M 1/00
(52) U.S. Cl. ........................... 341/133; 327/65; 327/77; 327/498
(58) Field of Search ................................. 341/133, 141; 327/498, 499, 500, 568–571, 195–198, 65, 89, 77

(56) References Cited

U.S. PATENT DOCUMENTS

| | | | |
|---|---|---|---|
| 3,569,733 A | 3/1971 | Weischedel | 307/222 |
| 3,701,148 A | 10/1972 | Frei | 340/347 AD |
| 5,132,557 A | 7/1992 | Uchida et al. | 307/352 |
| 5,140,188 A * | 8/1992 | Burns | 307/362 |
| 5,444,751 A | 8/1995 | Sage | 377/78 |
| 5,489,874 A * | 2/1996 | Tanoi | 327/560 |
| 5,563,530 A | 10/1996 | Frazier et al. | 326/132 |
| 5,930,323 A | 7/1999 | Tang et al. | 377/77 |
| 6,037,819 A | 3/2000 | Broekaert | 327/291 |
| 6,100,723 A * | 8/2000 | Broekaert | 327/77 |
| 6,252,430 B1 * | 6/2001 | van der Wagt et al. | 327/55 |

OTHER PUBLICATIONS

PCT Written Opinion dated May 29, 2001 for PCT/US00/00173 filed Jan. 5, 2000.

* cited by examiner

*Primary Examiner*—Brian Young
*Assistant Examiner*—John Nguyen
(74) *Attorney, Agent, or Firm*—Baker Botts L.L.P.

(57) ABSTRACT

A system for quantizing an analog signal comprises an input terminal for receiving an analog input signal, an inverted input terminal for receiving an inverted input signal, a clock terminal for receiving a clock signal, and an inverted clock terminal for receiving an inverted clock signal. A sample-and-hold circuit is coupled to the input terminal, the inverted input terminal, the clock terminal, and the inverted clock terminal. A comparator circuit is coupled to the sample-and-hold circuit, the clock terminal, and the inverted clock terminal. A latch circuit is coupled to the comparator circuit, the clock terminal, and the inverted clock terminal. An output terminal having a quantized output signal is coupled to the latch circuit. An inverted output terminal having an inverted output signal is coupled to the latch circuit.

12 Claims, 2 Drawing Sheets

SYSTEM FOR QUANTIZING AN ANALOG SIGNAL UTILIZING A RESONANT TUNNELING DIODE DIFFERENTIAL TERNARY QUANTIZER

RELATED APPLICATION

This application is a continuation of U.S. application Ser. No. 09/478,031 filed Jan. 5, 2000, which is a conversion of U.S. Provisional Application Ser. No. 60/115,195 filed Jan. 6, 1999.

TECHNICAL FIELD OF THE INVENTION

This invention relates generally to electronic quantizing and more particularly to a system for quantizing an analog signal utilizing a resonant tunneling diode differential ternary quantizer.

BACKGROUND OF THE INVENTION

Analog-to-digital converters have been formed in a variety of architectures. Conventionally, these architectures have been implemented with transistors. For example, one common implementation includes a cross-coupled pair of transistors. However, there are several disadvantages associated with using transistors to implement an analog-to-digital converter.

First, electronic components used in digital circuits are becoming smaller. As these devices decrease in size, quantum mechanical effects begin to appear. The electrical properties of conventional transistors may be unacceptably altered by quantum mechanical effects. Secondly, a transistor-implemented analog-to-digital converter is limited by the switching speed of the transistors, which may be too slow for some applications. Finally, conventional transistors are limited to two stable states. Thus, systems using transistors typically only convert analog signals into binary digital signals, making the use of multi-valued logic difficult.

SUMMARY OF THE INVENTION

In accordance with the present invention, a system for quantizing an analog signal utilizing a resonant tunneling diode differential ternary quantizer is provided that substantially eliminates or reduces the disadvantages or problems associated with previously developed quantizers. In particular, the present invention provides a system for quantizing an analog signal with a resonant tunneling diode differential ternary quantizer that minimizes the limitations of transistor-only implementations.

In one embodiment of the present invention, a system for quantizing an analog signal is provided that comprises an input terminal for receiving an analog input signal, an inverted input terminal for receiving an inverted input signal, a clock terminal for receiving a clock signal, and an inverted clock terminal for receiving an inverted clock signal. A sample-and-hold circuit is coupled to the input terminal, the inverted input terminal, the clock terminal, and the inverted clock terminal. A comparator is coupled to the sample-and-hold circuit, the clock terminal, and the inverted clock terminal. A latch is coupled to the comparator, the clock terminal, and the inverted clock terminal. An output terminal for providing a quantized output signal is coupled to the latch. An inverted output terminal for providing an inverted output signal is also coupled to the latch.

Technical advantages of the present invention include providing an improved system for quantizing an analog signal. In particular, a negative-resistance device such as a resonant tunneling diode is used to implement the analog-to-digital converter. Accordingly, reliance on transistors is avoided. As a result, quantum mechanical effects are not detrimental to system operation, switching speed is increased, and use of multi-valued logic is possible.

Other technical advantages of the present invention will be readily apparent to one skilled in the art from the following figures, descriptions, and claims.

BRIEF DESCRIPTION OF THE DRAWINGS

For a more complete understanding of the present invention and its advantages, reference is now made to the following description taken in conjunction with the accompanying drawings, wherein like reference numerals represent like parts, in which.

DETAILED DESCRIPTION OF THE INVENTION

The present invention and its advantages are best understood by referring now in more detail to FIGS. 1 through 5 of the drawings.

Figure 1:
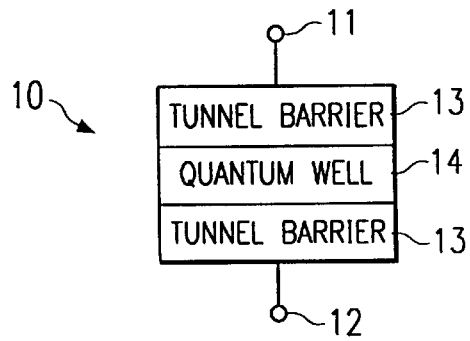
FIG. 1 is a schematic diagram of a resonant tunneling diode (RTD) for use as a negative-resistance element in accordance with the teachings of the present invention.

FIG. 1 is a schematic diagram of a resonant tunneling diode (RTD) 10 for use as a negative-resistance element in accordance with the teachings of the present invention. RTD 10 comprises an input terminal 11 for receiving an input signal, an output terminal 12 for producing an output signal, two tunnel barrier layers 13, and a quantum well layer 14.

Figure 2:
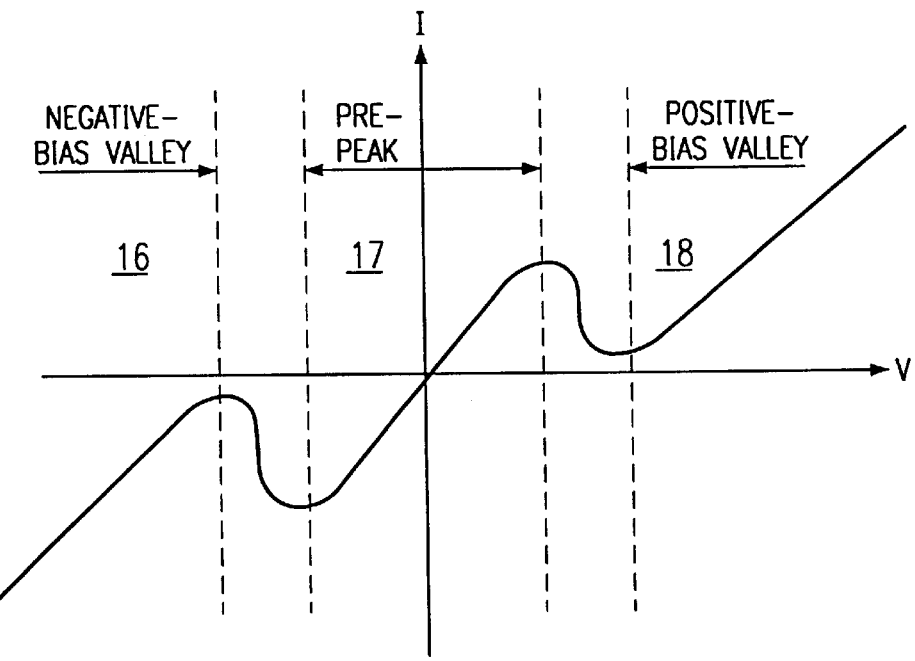
FIG. 2 is a graph of current as a function of voltage for a negative-resistance element illustrated in FIG. 1.

FIG. 2 is a graph showing current as a function of voltage for a negative-resistance element such as an RTD 10. The shape of this I-V curve is determined by the quantum effects that are a result of the extreme thinness of tunnel barrier layers 13 and quantum well layer 14. These layers 13 and 14 are approximately ten (10) to twenty (20) atoms thick.

When a voltage of low amplitude is applied to input terminal 11, almost no electrons tunnel through both tunnel barrier layers 13. This results in a negligible current and the RTD 10 is switched off. As the voltage increases, the energy of the electrons received at input terminal 11 also increases and the wavelength of these electrons decreases. When a particular voltage level is reached at input terminal 11, a specific number of electron wavelengths will fit within quantum well layer 14. At this point, resonance is established as electrons that tunnel through one tunnel barrier layer 13 remain in quantum well layer 14, giving those electrons opportunities to tunnel through the second tunnel barrier layer 13 to output terminal 12. Thus, a current flow is established from input terminal 11 to output terminal 12 and RTD 10 is switched on. However, if the voltage level continues to rise, eventually no electrons will have the proper wavelength to tunnel through tunnel barrier layers 13 and RTD 10 is switched off. This property of negative-resistance elements such as RTDs 10 that allows switching back and forth between on and off states as the voltage increases enables biasing to operate in one of three stable states, as illustrated in FIG. 2. These three stable states are the negative-bias valley region 16, the pre-peak region 17, and the positive-bias valley region 18.

Another property associated with the extreme thinness of tunnel barrier layers 13 and quantum well layer 14 of RTD 10 relates to switching speed. Because each of these layers 13 and 14 are only about ten (10) to twenty (20) atoms thick, an electron only travels about 0.01 microns from input terminal 11 to output terminal 12. Because of this short distance, RTD 10 switches on and off at a very high rate.

Figure 3:
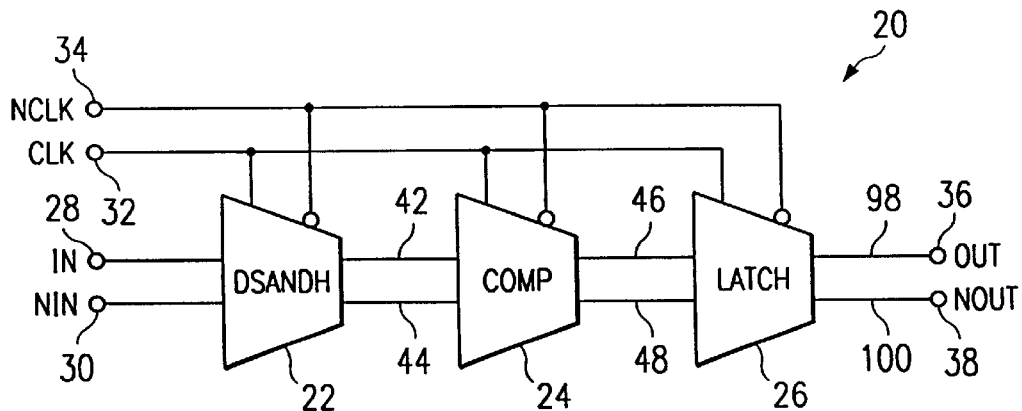
FIG. 3 is a circuit diagram illustrating a system for quantizing an analog signal in accordance with one embodiment of the present invention.

FIG. 3 is a circuit diagram illustrating a system 20 for quantizing an analog signal in accordance with one embodiment of the present invention. System 20 comprises a sample-and-hold circuit 22, a comparator 24, and a latch 26. Also comprising the system 20 is an input terminal 28 for receiving an analog input signal, an inverted input terminal 30 for receiving an inverted input signal, a clock terminal 32 for receiving a clock signal, an inverted clock terminal 34 for receiving an inverted clock signal, an output terminal 36 for the quantized output signal, and an inverted output terminal 38 for an inverted output signal. The sample-and-hold circuit 22 is coupled to input terminal 28, inverted input terminal 30, clock terminal 32, and inverted clock terminal 34. The comparator 24 is connected to the sample-and-hold circuit 22 by lines 42 and 44 and is coupled to the clock terminal 32 and the inverted clock terminal 34. The latch 26 is connected to the comparator 24 by lines 46 and 48 and is coupled to clock terminal 32 and inverted clock terminal 34. The output terminal 36 and inverted output terminal 38 are coupled to the latch 26.

According to one embodiment of the present invention, the input signal received at input terminal 28 comprises a varying current, while the output signal at output terminal 36 comprises a varying voltage. In addition, the input signal may comprise a signal in the X-band range (10 or more gigahertz).

Figure 4:
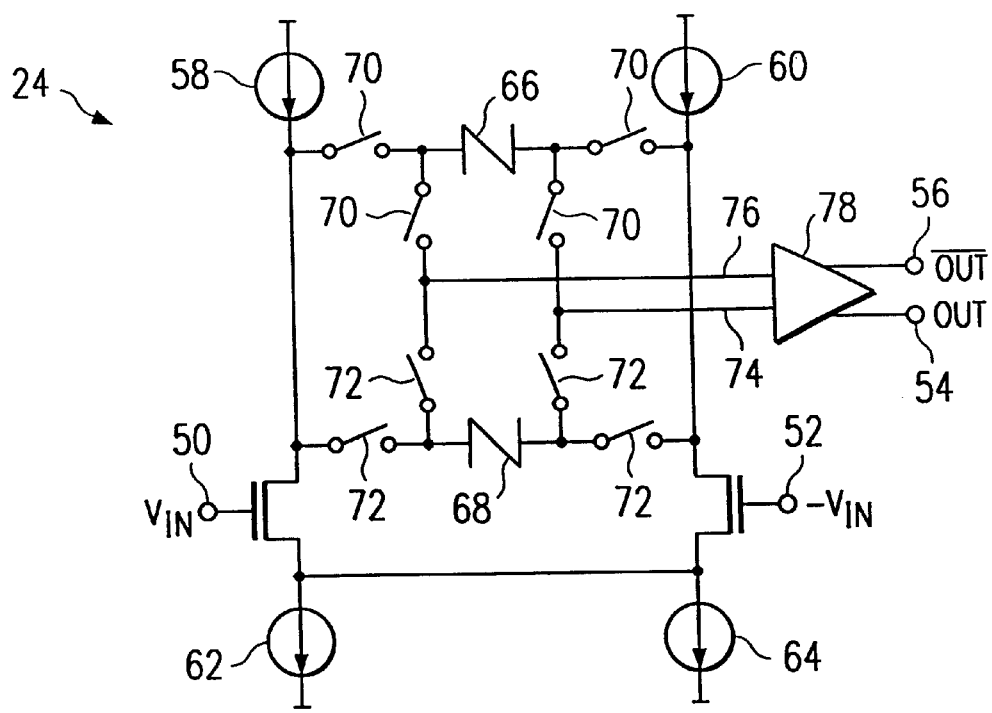
FIG. 4 is a circuit diagram illustrating the comparator of FIG. 3.

FIG. 4 is a circuit diagram illustrating the comparator 24. Comparator 24 comprises a comparator input terminal 50 and an inverted comparator input terminal 52 for receiving the output signals from the sample-and-hold circuit 22. Also comprising the comparator 24 is a comparator output terminal 54 and an inverted comparator output terminal 56 for transmission of the output signals to the latch 26. Comparator 24 also comprises a first current source 58, a second current source 60, a third current source 62, and a fourth current source 64.

The comparator 24 further comprises a first negative-resistance device 66 and a second negative-resistance device 68. Coupled to the first negative-resistance device 66 are four switches 70, and coupled to the second negative-resistance device 68 are four switches 72. Comparator 24 also includes connecting lines 74 and 76 that transmit signals to an amplifier 78 having outputs connected to comparator output terminal 54 and inverted comparator output terminal 56.

According to the present invention, the first negative-resistance device 66 and the second negative-resistance device 68 each comprise an RTD. One method of resetting an RTD is to disconnect the diode from the circuit, allowing the RTD to discharge. In comparator 24, the first negative-resistance device 66 is disconnected from the circuit by opening switches 70. The second negative-resistance device 68 is disconnected from the circuit by opening switches 72.

According to the present invention, switches 70 are closed during one clock cycle while switches 72 are open, allowing the second negative-resistance device 68 to discharge. During this clock cycle, the first negative-resistance device 66 is coupled to lines 74 and 76 and thereby applies a signal to amplifier 78. During the next clock cycle, the first negative-resistance device 66 is disconnected from the circuit by opening switches 70, allowing the first negative-resistance device to discharge. At the same time, the second negative-resistance device 68 is coupled to lines 74 and 76 when switches 72 are closed, allowing the second negative-resistance device to provide a signal to the amplifier 78.

In the comparator 24, the negative-resistance devices 66 and 68 operate in the pre-peak region 17 when the input voltage is zero. This produces an output signal of zero. However, when the input voltage reaches a specified value, the negative-resistance devices 66 and 68 are forced during alternating clock cycles into either the negative-bias valley region 16, thereby producing an output signal of −1, or the positive-bias valley region 18, to produce an output signal of +1.

Figure 5:
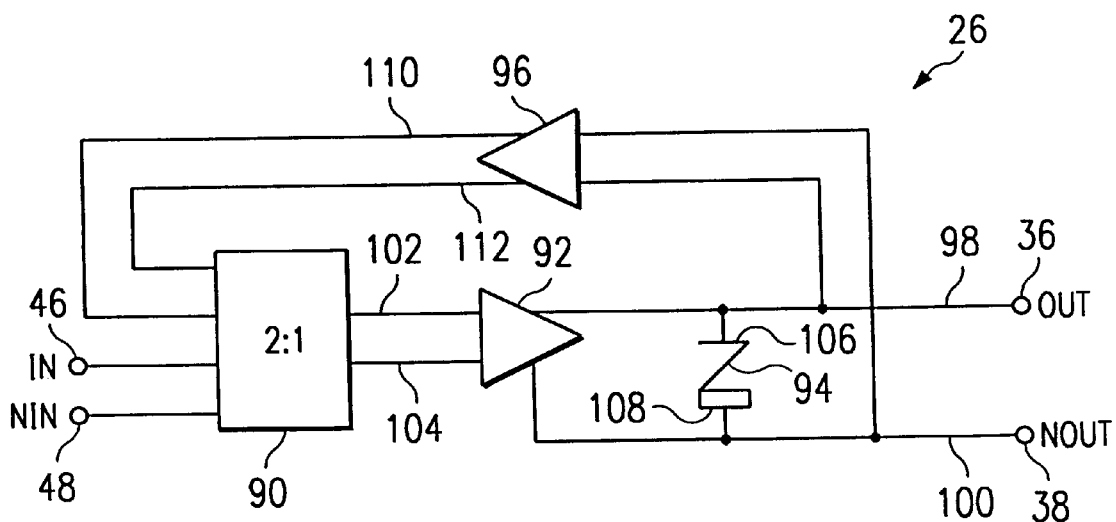
FIG. 5 is a circuit diagram illustrating the latch of FIG. 3.

FIG. 5 is a circuit diagram illustrating the latch 26. The latch 26 comprises a two-to-one multiplexer 90, a latch amplifier 92, a negative-resistance device 94, and a feedback amplifier 96. According to one embodiment, the negative-resistance device 94 comprises an RTD. Latch 26 further comprises a latch input terminal connected to line 46, an inverted latch input terminal connected to line 48, latch output terminal connected to line 98, and inverted latch output terminal connected to line 100. Latch amplifier 92 is connected to the two-to-one multiplexer 90 by connecting lines 102 and 104. Negative-resistance device 94 is connected to the output of the latch amplifier 92 at terminals 106 and 108. Also coupled to the negative-resistance device 94 at the terminals 106 and 108 is the feedback amplifier 96. The two-to-one multiplexer 90 is coupled to the input terminal by connecting line 46 and the inverted input terminal by connecting line 48. The two-to-one multiplexer 90 is also coupled to the feedback amplifier 96 by connecting lines 110 and 112. The latch output terminal 36 is coupled to negative-resistance device 94 at the terminal 106, and inverted latch output terminal 38 is coupled to negative-resistance device 94 at terminal 108. The latch output terminal 36 is the output terminal 34 of system 20 shown in FIG. 3, and the inverted latch output terminal 38 is the inverted output terminal of system 20.

The latch 26 receives a comparator output signal and an inverted comparator output signal from the comparator 24 transmitted on connecting lines 46 and 48. During one clock cycle, the signals received over connecting lines 46 and 48 are applied to the two-to-one multiplexer 90 and will be the outputs on connecting lines 102 and 104. During the next clock cycle, the signals received by the two-to-one multiplexer 90 from the feedback amplifier 96 on lines 110 and 112 will be outputs on lines 102 and 104.

In the latch 26, the negative-resistance device 94 operates in the pre-peak region 17 when the current through the device received over connecting lines 106 and 108 is zero. This produces an output signal of zero. However, when the current on the connecting lines 106 and 108 reaches a specified value, the negative-resistance device 94 is forced into either the negative-bias valley region 16, which produces an output signal of −1, or the positive-bias valley region 18, which produces an output signal of +1.

According to the present invention, the latch amplifier 92 amplifies the signals received on lines 102 and 104 and the feedback amplifier 96 amplifies the signals received over lines 106 and 108. In one embodiment, latch output terminal 36 produces a +1 for the output signal when the input signal is greater than a first threshold, a −1 for the output signal when the input signal is less than a second threshold, and a zero for the output signal when the input signal is between the first threshold and the second threshold.

Although the present invention has been described, various changes and modifications may be suggested in the art. It is intended that the present invention encompass such changes and modifications as fall within the scope of the appended claims.

What is claimed is:

1. A comparator for a system for quantizing an analog signal, comprising:
    a plurality of eight switches;
    a first negative-resistance device having a first terminal coupled to a first switch and a second switch of the plurality of eight switches and having a second terminal coupled to a third switch and a fourth switch of the plurality of eight switches;
    a second negative-resistance device having a first terminal coupled to a fifth switch and a sixth switch of the plurality of eight switches and having a second terminal coupled to a seventh switch and an eighth switch of the plurality of eight switches;
    a comparator input terminal coupled to the first switch and the fifth switch;
    an inverted comparator input terminal coupled to the third switch and the seventh switch; and
    an output circuit coupled to the second switch, the fourth switch, the sixth switch and the eighth switch and providing a comparator output signal.

2. The comparator of claim 1, further comprising:
    a first current source coupled to the first switch and the fifth switch;
    a second current source coupled to the third switch and the seventh switch;
    a third current source coupled to the comparator input terminal and the inverted comparator input terminal; and
    a fourth current source coupled to the inverted comparator input terminal and the comparator input terminal.

3. The comparator of claim 2 wherein the comparator further comprises the comparator input terminal couples to the first switch, the fifth switch, the first current source, the third current source, and the fourth current source, and the inverted comparator input terminal couples to the third switch, the seventh switch, the second current source, the third current source, and the fourth current source.

4. The comparator of claim 1 wherein the first negative-resistance device and the second negative-resistance device comprise a resonant tunneling diode.

5. The comparator of claim 1 wherein the output circuit comprises:
    an output amplifier coupled to the second switch, the fourth switch, the sixth switch and the eighth switch;
    a comparator output terminal coupled to the output amplifier to provide a comparator output signal; and
    an inverted comparator output terminal also coupled to the output amplifier to provide an inverted comparator output signal.

6. The comparator of claim 1 wherein the first switch, the second switch, the third switch and the fourth switch of the plurality of eight switches open and close at substantially the same time in an operating cycle.

7. The comparator of claim 6 wherein the fifth switch, the sixth switch, the seventh switch and the eighth switch of the plurality of eight switches open and close at substantially the same time in the operating cycle, wherein when the switches one through four open switches five through eight close and when switches one through four close switches five through eight open.

8. A comparator for a system for quantizing an analog signal, comprising:
    a first current source;
    a second current source;
    a first negative-resistance device having a first terminal coupled to the first current source and having a second terminal coupled to the second current source;
    a second negative-resistance device having a first terminal coupled to the first current source and having a second terminal coupled to the second current source;
    a comparator input terminal coupled to the first current source, the first negative-resistance device and the second negative-resistance device;
    an inverted comparator input terminal coupled to the second current source, the first negative-resistance device and the second negative-resistance device;
    an output circuit coupled to the first negative-resistance device and the second negative-resistance device, the first current source and the second current source;
    a third current source coupled to the comparator input terminal and the inverted comparator input terminal; and
    a fourth current source coupled to the inverted comparator input terminal and the comparator input terminal.

9. The comparator of claim 8 wherein the output circuit comprises:
    an output amplifier coupled to the first current source, the second current source, the first negative-resistance device and the second negative-resistance device;
    a comparator output terminal coupled to the output amplifier to provide a comparator output signal; and
    an inverted comparator output terminal also coupled to the output amplifier to provide an inverted comparator output signal.

10. A latch circuit for a system for quantizing an analog signal comprises:
    a latch amplifier;
    a negative-resistance device having a first terminal coupled to the latch amplifier and a second terminal coupled to the latch amplifier;
    a feedback amplifier coupled to the first terminal and the second terminal of the negative-resistance device, the feedback amplifier producing a first feedback output and a second feedback output;
    a two-to-one multiplexer coupled to a latch input terminal, an inverted latch input terminal, the first feedback output, the second feedback output, and the latch amplifier; and
    wherein the multiplexer operates to pass the signals associated with the latch input terminal and the inverted latch input terminal during one clock cycle to the latch amplifier and pass the signals associated with the first feedback output and the second feedback output during the next clock cycle to the latch amplifier.

11. The latch circuit of claim 10 wherein the negative-resistance device comprises a resonant tunneling diode.

12. The latch circuit of claim 10 wherein the latch amplifier has an output signal comprising one of three levels represented by −1, 0, and +1.

* * * * *

UNITED STATES PATENT AND TRADEMARK OFFICE
CERTIFICATE OF CORRECTION

PATENT NO.   : 6,366,226 B2                                              Page 1 of 1
DATED        : April 2, 2002
INVENTOR(S)  : Tom P.E. Broekaert It is certified that error appears in the above-identified patent and that said Letters Patent is hereby corrected as shown below:

<u>Column 1,</u>
Line 11, after the "RELATED APPLICATION" section insert:
-- GOVERNMENT INTEREST
      This invention was made with Government support under contract number N66001-96-C-8620 awarded by the Department of the Navy. The Government has certain rights in this invention. --.

Signed and Sealed this

Eighth Day of July, 2003

JAMES E. ROGAN
*Director of the United States Patent and Trademark Office*